United States Patent
Kuboki

(10) Patent No.: US 9,404,938 B2
(45) Date of Patent: Aug. 2, 2016

(54) ACCELERATION SENSOR

(71) Applicant: MURATA MANUFACTURING CO., LTD., Nagaokakyo-Shi, Kyoto-Fu (JP)

(72) Inventor: Takamasa Kuboki, Nagaokakyo (JP)

(73) Assignee: MURATA MANUFACTURING CO., LTD., Nagaokakyo-Shi, Kyoto-Fu (JP)

(*) Notice: Subject to any disclaimer, the term of this patent is extended or adjusted under 35 U.S.C. 154(b) by 402 days.

(21) Appl. No.: 13/916,015

(22) Filed: Jun. 12, 2013

(65) Prior Publication Data
US 2014/0007686 A1    Jan. 9, 2014

Related U.S. Application Data

(63) Continuation of application No. PCT/JP2011/072516, filed on Sep. 30, 2011.

(30) Foreign Application Priority Data

Dec. 24, 2010    (JP) ................ 2010-287506

(51) Int. Cl.
*G01P 15/09* (2006.01)
*H01L 41/113* (2006.01)

(52) U.S. Cl.
CPC .......... *G01P 15/09* (2013.01); *G01P 15/0922* (2013.01); *H01L 41/1132* (2013.01)

(58) Field of Classification Search
CPC ..................................... G01P 15/09
USPC ..................................... 73/514.34
See application file for complete search history.

(56) References Cited

U.S. PATENT DOCUMENTS

| 6,603,264 | B1 | 8/2003 | Hirao et al. |
| 6,744,181 | B1 | 6/2004 | Ogiura et al. |
| 6,766,690 | B2 | 7/2004 | Tabota |
| 7,624,639 | B2 * | 12/2009 | Eimori ............... G01P 15/0922 73/514.16 |

(Continued)

FOREIGN PATENT DOCUMENTS

| CN | 1178326 A | 4/1998 |
| JP | 06-324073 A | 11/1994 |
| JP | 11-030628 A | 2/1999 |
| JP | H-11-183510 A | 7/1999 |

(Continued)

OTHER PUBLICATIONS

Written Opinion and International Search Report issued in PCT/JP2011/072516, mailed on Jan. 17, 2012.

*Primary Examiner* — Hezron E Williams
*Assistant Examiner* — Tarun Sinha
(74) *Attorney, Agent, or Firm* — Arent Fox LLP

(57) ABSTRACT

An acceleration sensor where the accuracy of acceleration detection is unlikely to fall even when the ambient temperature changes. A piezoelectric substrate includes a polarized central portion and first and second end portions. A first electrode is formed on a first main surface of the piezoelectric substrate so as to extend from the first end portion to the second end portion. A second electrode is formed inside the piezoelectric substrate so as to extend across the second end portion and the central portion. The second electrode opposes the first electrode in the central portion in a thickness direction. A supporting member clamps the second end portion. The piezoelectric substrate is formed such that a distance between the first electrode and the second electrode in the second end portion is greater than a distance between the first electrode and the second electrode in the central portion.

18 Claims, 3 Drawing Sheets

(56) References Cited

U.S. PATENT DOCUMENTS

| | | | |
|---|---|---|---|
| 2003/0217598 A1 | 11/2003 | Tabota | |
| 2004/0256953 A1* | 12/2004 | Kitagawa | B41J 2/14233 310/324 |
| 2007/0120442 A1* | 5/2007 | Piotr | H02N 2/025 310/323.01 |
| 2010/0091429 A1* | 4/2010 | Koga | H01G 4/012 361/321.2 |

FOREIGN PATENT DOCUMENTS

| | | |
|---|---|---|
| JP | 2003-337140 A | 11/2003 |
| JP | 2005-164505 A | 6/2005 |
| JP | 2007-088696 A | 4/2007 |
| JP | 2007-315958 A | 12/2007 |
| JP | 2008-232697 A | 10/2008 |
| JP | 2009-008512 A | 1/2009 |
| WO | WO-2007-132588 A1 | 11/2007 |

* cited by examiner ature of the atmosphere in which the acceleration sensor is arranged changes.

That is, when the temperature of the atmosphere in which the acceleration sensor is arranged increases, heat is transmitted to the portion of the piezoelectric substrate that is clamped by the supporting member via the supporting member. Consequently, when the portion of the piezoelectric substrate that is clamped by the supporting member is polarized, charge is generated due to the pyroelectric effect and a voltage that is higher than a voltage corresponding to the magnitude of the acceleration applied to the acceleration sensor is extracted from the acceleration sensor. Therefore, the acceleration cannot be detected with high accuracy.

With respect to this, in the acceleration sensor 100, the portion of the piezoelectric substrate 111 that is clamped by the supporting member 101 is not polarized. Consequently, in the piezoelectric substrate 111, even in the case where the temperature of the atmosphere in which the acceleration sensor 100 is arranged increases, it is not likely that charge will be generated by the pyroelectric effect. Therefore, with the acceleration sensor 100, the acceleration can be detected with high accuracy regardless of a change in the temperature of the atmosphere in which the acceleration sensor 100 is arranged.

The following method is described in Patent Document 1 as a method of manufacturing the above-described acceleration sensor 100. First, for a plurality of first electrodes 112a, portions of electrodes 112a1 and 112a2 to be formed on the surfaces of the piezoelectric substrate 111 other than the portions that will be located in the clamped portion are formed and the second electrode 112b is formed. Next, the piezoelectric substrate 111 is polarized. A method is then described for forming the remaining portions of the electrodes 112a1 and 112a2.

Patent Document 1: WO 2007/132588 A1

However, in the acceleration sensor 100, it is necessary to divide the forming of the electrodes 112a1 and 112a2 into two steps. Consequently, there is a problem in that the manufacturing method is complex.

In addition, from the viewpoint of making the sensitivity of the acceleration sensor 100 high, it is preferable to make the portion of the piezoelectric substrate 111 that is polarized large. Accordingly, it is preferable that polarization be performed in a state where the electrodes have been formed over the entirety of the piezoelectric substrate 111 except for the clamped portion of the piezoelectric substrate 111. However, in this case if the accuracy with which the electrodes are formed is low or the accuracy with which the piezoelectric element 110 is combined with the supporting member 101 is low, part of the portion of the piezoelectric substrate 111 that is polarized may be clamped by the supporting member 101. Therefore, there is a problem in that manufacture of the acceleration sensor 100 is difficult.

SUMMARY OF THE INVENTION

The present invention was made in view of these points and an object thereof is to provide an acceleration sensor in which the accuracy of acceleration detection is not likely to fall even if the ambient temperature changes and which is simple to manufacture.

An acceleration sensor according to the present invention includes a piezoelectric element, a supporting member, a first outer electrode and a second outer electrode. The piezoelectric element includes a piezoelectric substrate, a first electrode and a second electrode. The piezoelectric substrate has first and second main surfaces. The piezoelectric substrate includes a central portion in a first direction, a first end portion located on one side of the central portion in the first direction and a second end portion located on the other side of the central portion in the first direction. The central portion is polarized. The first electrode is formed on the first main surface of the piezoelectric substrate so as to extend from the first end portion to the second end portion. The second electrode is formed inside the piezoelectric substrate so as to extend across the second end portion and the central portion. The second electrode opposes the first electrode in the central portion in a thickness direction of the piezoelectric substrate. The supporting member clamps the second end portion. An internal space is formed in the supporting member, the piezoelectric element being accommodated in the internal space. The first outer electrode is formed on an outer surface of the supporting member. The first electrode is electrically connected to the first outer electrode. The second outer electrode is formed on an outer surface of the supporting member. The second electrode is electrically connected to the second outer electrode. The piezoelectric substrate is formed such that a distance between the first electrode and the second electrode in the second end portion is greater than a distance between the first electrode and the second electrode in the central portion.

In a certain specific aspect of the acceleration sensor according to the present invention, a thickness of a portion of the piezoelectric substrate located between the first electrode and the second electrode in the second end portion is greater than a thickness of a portion of the piezoelectric substrate located between the first electrode and the second electrode in the central portion.

In another specific aspect of the acceleration sensor according to the present invention, the thickness of the portion of the piezoelectric substrate located between the first electrode and the second electrode in the second end portion is 1.5 times or more the thickness of the portion of the piezoelectric substrate located between the first electrode and the second electrode in the central portion.

In certain specific aspect of the acceleration sensor according to the present invention, the supporting member includes a pair of plate-shaped members that clamp the second end portion therebetween at an end portion on the other side in the first direction and a connecting member that forms the internal space by connecting the pair of plate-shaped members to each other.

In another specific aspect of the acceleration sensor according to the present invention, the first end portion is a free end.

According to the present invention, an acceleration sensor is provided in which the accuracy of acceleration detection is not likely to fall even when the ambient temperature changes and which is simple to manufacture.

DETAILED DESCRIPTION OF THE PREFERRED EMBODIMENTS OF THE INVENTION

Figure 1:
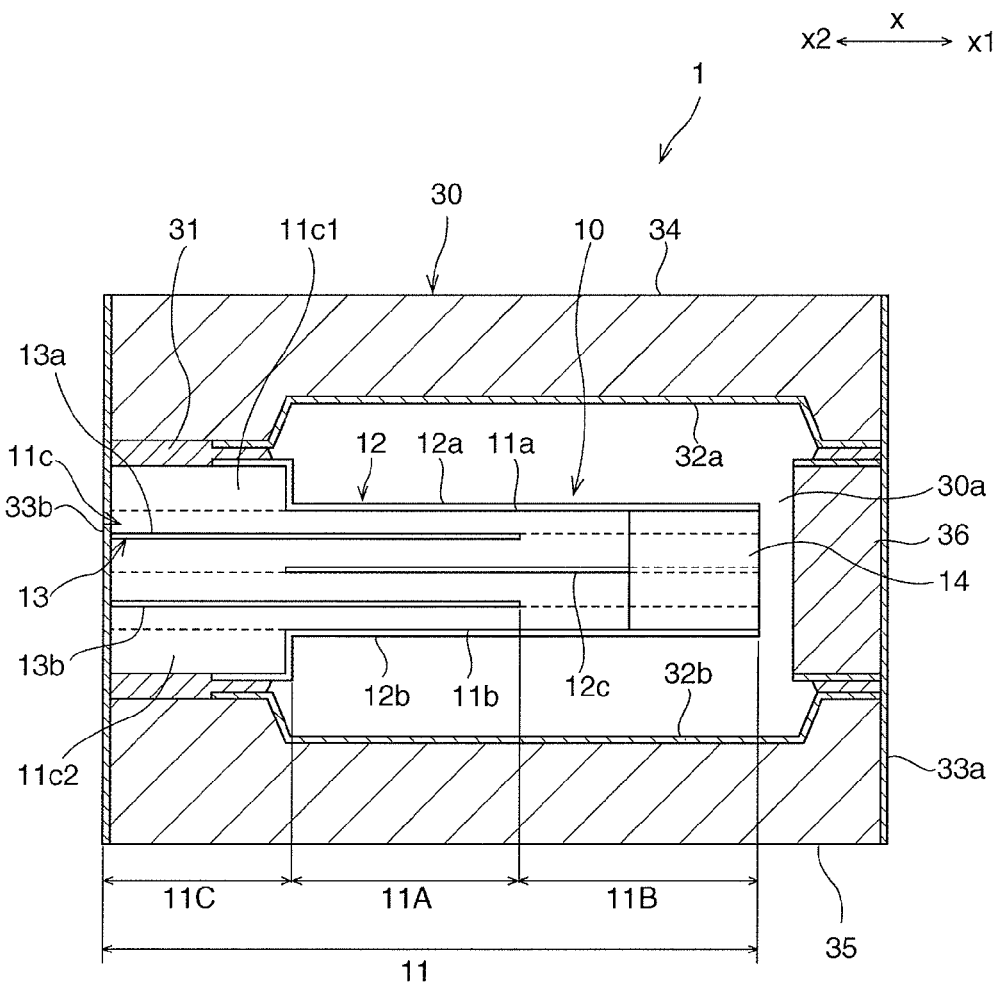
FIG. 1 is a schematic sectional view of an acceleration sensor according to a first embodiment.

Hereafter, examples of preferred modes for carrying the present invention will be described. However the following embodiments are merely illustrative. The present invention is in no way limited to the following embodiments.
(First Embodiment)
FIG. 1 is a schematic sectional view of an acceleration sensor according to the present embodiment. As illustrated in FIG. 1, the acceleration sensor 1 includes a piezoelectric element 10 and a supporting member 30.

The piezoelectric element 10 includes a piezoelectric substrate 11 having a first main surface 11a and a second main surface 11b, and first and second electrodes 12 and 13. The piezoelectric substrate 11 can be formed of a suitable piezoelectric material. The piezoelectric substrate 11 for example can be formed of lead zirconate titanate (PZT). In this embodiment, the piezoelectric substrate 11 is formed of a multilayer body including a plurality of piezoelectric layers 11c.

The piezoelectric substrate 11 includes a central portion 11A in an x direction, a first end portion 11B located on an x1 side of the central portion 11A in the x direction, and a second end portion 11C located on an x2 side of the central portion 11A in the x direction.

The first electrode 12 includes electrodes 12a to 12c. The electrode 12a is formed on the first main surface 11a. In more detail, the electrode 12a is formed on the first main surface 11a so as to extend from the first end portion 11B to the second end portion 11C via the central portion 11A. The electrode 12a is formed so as to extend to an end surface on the x1 side of the first main surface 11a and so as not to extend to an end surface on the x2 side of the first main surface 11a.

The electrode 12b is formed on the second main surface 11b. In more detail, the electrode 12b is formed on the second main surface 11b so as to extend from the first end portion 11B to the second end portion 11C via the central portion 11A. The electrode 12b is formed so as to extend to an end surface on the x1 side of the second main surface 11b and so as not to extend to an end surface on the x2 side of the second main surface 11b.

The electrode 12c is formed parallel to the first and second main surfaces 11a and 11b inside the piezoelectric substrate 11. The electrode 12c is formed in the first end portion 11B and the central portion 11A. The electrode 12c is not formed in the second end portion 11C.

The electrodes 12a to 12c are connected to one another via an electrode 14 formed on a side surface of the first end portion 11B of the piezoelectric substrate 11.

The second electrode 13 includes electrodes 13a and 13b. The electrodes 13a and 13b are formed parallel to the first and second main surfaces 11a and 11b inside the piezoelectric substrate 11. The electrode 13a is located between the electrode 12a and the electrode 12c in the thickness direction. The electrode 13b is located between the electrode 12b and the electrode 12c in the thickness direction. The electrodes 13a and 13b are formed in the central portion 11A and the second end portion 11C. Accordingly, the electrodes 13a and 13b oppose the electrodes 12a to 12c in the thickness direction in the central portion 11A. The electrodes 13a and 13b are drawn out to the x2 side end portion and both side surfaces of the piezoelectric substrate 11.

In this embodiment, the piezoelectric substrate 11 is formed such that the distance between the electrode 12a and the electrode 13a in the second end portion 11C is greater than the distance between the electrode 12a and the electrode 13a in the central portion 11A, and the distance between the electrode 12b and the electrode 13b in the second end portion 11C is greater than the distance between the electrode 12b and the electrode 13b in the central portion 11A. Specifically, piezoelectric layers 11c1 and 11c2 are additionally provided only in the second end portion 11C. Thus, the thickness of a portion located between the electrode 12a and the electrode 13a in the second end portion 11C is greater than the thickness of a portion located between the electrode 12a and the electrode 13a in the central portion 11A. As a result, the distance between the electrode 12a and the electrode 13a in the second end portion 11C is greater than the distance between the electrode 12a and the electrode 13a in the central portion 11A. In addition, the thickness of a portion located between the electrode 12b and the electrode 13b in the second end portion 11C is greater than the thickness of a portion located between the electrode 12b and the electrode 13b in the central portion 11A. As a result, the distance between the electrode 12b and the electrode 13b in the second end portion 11C is greater than the distance between the electrode 12b and the electrode 13b in the central portion 11A.

In addition, the distance between the electrode 12a and the electrode 13a in the second end portion 11C is preferably 1.5 times or more, more preferably 2 times or more and even more preferably 3 times or more the distance between the electrode 12a and the electrode 13a in the central portion 11A. The distance between the electrode 12b and the electrode 13b in the second end portion 11C is preferably 1.5 times or more, more preferably 2 times or more and even more preferably 3 times or more the distance between the electrode 12b and the electrode 13b in the central portion 11A.

The piezoelectric element 10 is provided inside the supporting member 30. Specifically, the piezoelectric element 10 is accommodated in an internal space 30a formed inside the supporting member 30. The piezoelectric element 10 is fixed to the supporting member 30 by being clamped by the supporting member 30 in a portion in which the second end portion 11C is provided. The central portion 11A and the first end portion 11B of the piezoelectric element 10 are not in contact with the supporting member 30. Accordingly, in this embodiment, the piezoelectric element 10 is attached to the supporting member 30 in a cantilever state such that the first end portion 11B is a free end. Of course, in the present invention, the piezoelectric element may be attached to the supporting member in a double-supported beam state.

In this embodiment, the supporting member 30 includes first and second supporting member pieces 34 and 35 and a connecting member 36. Frame-shaped protruding portions are provided on peripheral portions of the first and second supporting member pieces 34 and 35 and the first and second supporting member pieces 34 and 35 are arranged such that the protruding portions oppose each other. The second end portion 11C is clamped by parts of the protruding portions of the first and second supporting member pieces 34 and 35. Parts of the protruding portions of the first and second supporting member pieces 34 and 35 other than those that clamp the second end portion 11C are connected to each other via the connecting member 36. The material of the connecting member 36 for example may be the same material as the piezoelectric element 10 or may be a different material.

The material of the supporting member 30 is not particularly limited so long as it is a material that is capable of supporting the piezoelectric element 10 and has insulation properties. The supporting member 30 for example may be formed of a ceramic or a resin or may be formed of a metal member to which an insulating coating has been applied.

The piezoelectric element 10 and the supporting member 30 are bonded to each other with a conductive adhesive layer 31. Thus, the electrodes 12a and 12b are electrically connected to electrodes 32a and 32b formed on inner surfaces of the supporting member 30. The electrodes 32a and 32b are connected to a first outer electrode 33a formed on an outer surface of the supporting member 30. In addition, the electrode 12c is connected to the electrodes 12a and 12b by the electrode 14 and therefore is connected to the first outer electrode 33a via the electrodes 12a and 12b, the conductive adhesive layer 31 and the electrodes 32a and 32b.

On the other hand, the electrodes 13a and 13b are connected to a second outer electrode 33b formed on an outer surface of the supporting member 30.

In addition, the electrodes 12 to 14, 32a, 32b, 33a and 33b are not particularly limited so long as they are formed of a conductive material. The electrodes 12 to 14, 32a, 32b, 33a and 33b for example can be formed of a metal such as aluminum or silver or an alloy.

Next, an example of a method of manufacturing the acceleration sensor 1 of this embodiment will be described.

First, the piezoelectric element 10 is manufactured. The piezoelectric element 10 for example can be manufactured using a known method. The piezoelectric element 10 can be for example formed by appropriately stacking ceramic green sheets having conductive paste layers formed on surfaces thereof and then performing firing. The electrodes 12a and 12b may be formed by co-firing or may be formed by post-firing. That is, after forming the piezoelectric substrate 11 having the electrodes 12c, 13a and 13b inside thereof, the electrodes 12a and 12b may be formed by applying a conductive paste and then performing firing.

In this embodiment, an example was described in which the second end portion 11C is formed so as to be thicker than the first end portion 11B and the central portion 11A by providing the piezoelectric layers 11c1 and 11c2, but the second end portion may be made thicker than the first end portion and the central portion by removing part of the surface of the formed piezoelectric substrate by dicing or the like.

Next, a voltage is applied between the electrodes 12 and 13 to polarize the piezoelectric substrate 11. Thus, the central portion 11A is polarized. In this way, the piezoelectric element 10 is completed. The piezoelectric substrate 11 may be polarized after combining the piezoelectric element 10 with the supporting member 30.

Next, the first and second supporting member pieces 34 and 35 on which the electrodes 32a and 32b have been formed and the piezoelectric element 10 are bonded to one another by using a conductive adhesive. An anisotropic conductive adhesive composed of a resin including conductive particles can be used as the conductive adhesive.

Finally, the acceleration sensor 1 can be completed by forming the first and second outer electrodes 33a and 33b. The first and second outer electrodes 33a and 33b for example can be formed by applying a conductive paste, sputtering or plating.

As has been described above, in this embodiment, in the second end portion 11C clamped by the supporting member 30, the distance between the electrodes 12a and 12b and the electrodes 13a and 13b is long. Consequently, even in the case where the piezoelectric substrate 11 is polarized after the entireties of the electrodes 12a and 12b have been formed, the second end portion 11C is polarized much less than the central portion 11A. That is, the degree of polarization of the second end portion 11C is small. Therefore, even in the case where the temperature of the atmosphere in which the acceleration sensor 1 is arranged increases and the temperature of the second end portion 11C increases, charge is not likely to be generated in the second end portion 11C due to the pyroelectric effect. Therefore, in the acceleration sensor 1, a decrease in the accuracy with which acceleration is detected when there is a change in ambient temperature is suppressed. From the viewpoint of more effectively suppressing a decrease in the accuracy with which acceleration is detected when there is a change in ambient temperature, the distance between the electrode 12a and the electrode 13a in the second end portion 11C is preferably 1.5 times or more, more preferably 2 times or more and even more preferably 3 times or more the distance between the electrode 12a and the electrode 13a in the central portion 11A. The distance between the electrode 12b and the electrode 13b in the second end portion 11C is preferably 1.5 times or more, more preferably 2 times or more and even more preferably 3 times or more the distance between the electrode 12b and the electrode 13b in the central portion 11A.

In addition, with the acceleration sensor 1, the electrodes 12a and 12b can be formed together before performing polarization. In addition, the demanded accuracy with which the electrodes 12a and 12b are formed is low. Therefore, the acceleration sensor 1 can be easily manufactured.

Hereafter, another example of a preferred mode for carrying out the present invention will be described. In the following description, members having substantially the same functions as those of the first embodiment will be referred to using the same symbols and description thereof will be omitted.

(Second Embodiment)

Figure 2:
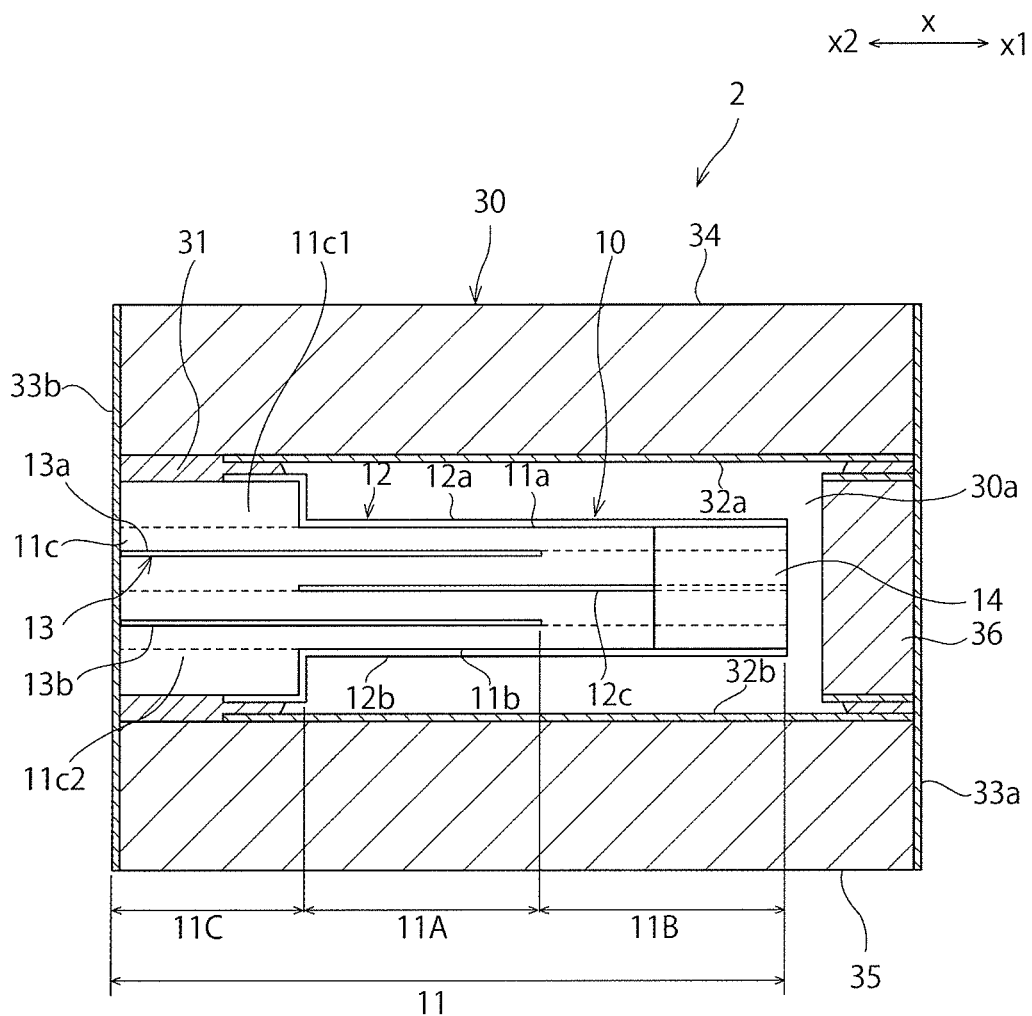
FIG. 2 is a schematic sectional view of an acceleration sensor according to a second embodiment.
Figure 3:
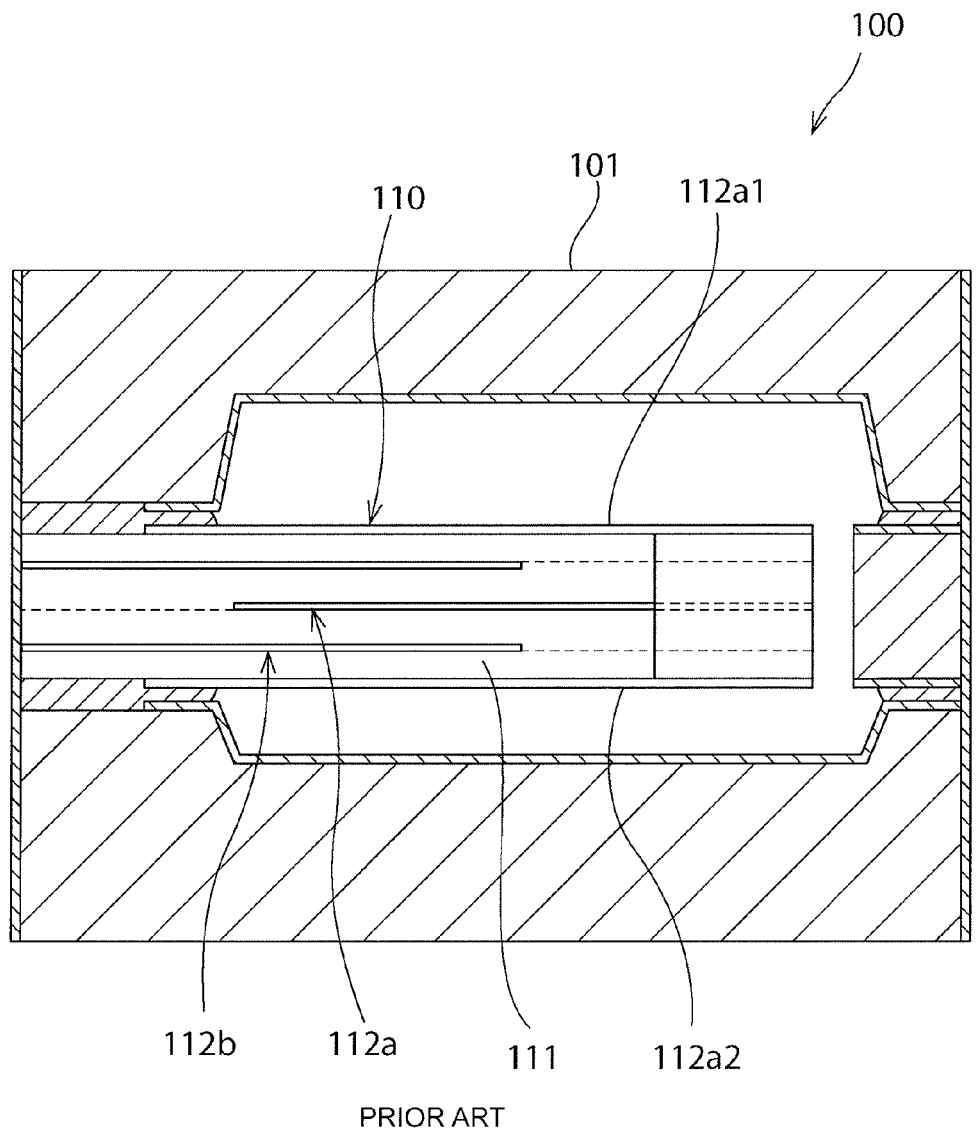
FIG. 3 is a schematic sectional view of a conventional acceleration sensor described in Patent Document 1.

FIG. 2 is a schematic sectional view of an acceleration sensor according to a second embodiment.

As illustrated in FIG. 2, in an acceleration sensor 2, the first and second supporting member pieces 34 and 35 are formed so as to each have a flat-plate-like shape. Consequently, the first and second supporting member pieces 34 and 35 can be easily manufactured.

REFERENCE SIGNS LIST 1, 2 . . . acceleration sensor
10 . . . piezoelectric element
11 . . . piezoelectric substrate
11A . . . central portion
11B . . . first end portion
11C . . . second end portion
11a . . . first main surface
11b . . . second main surface
11c1, 11c2 . . . piezoelectric layer
12 to 14, 32a, 32b electrode
30 . . . supporting member
30a . . . internal space
31 . . . conductive adhesive layer
33a . . . first outer electrode
33b . . . second outer electrode
34 . . . first supporting member piece
35 . . . second supporting member piece
36 . . . connecting member

The invention claimed is:

1. An acceleration sensor comprising:
a piezoelectric element including:
a piezoelectric substrate having a central portion, a first end portion disposed on one side of the central portion, and a second end portion disposed on a second side of the central portion opposite the first side,
a first electrode disposed on at least a first surface of the piezoelectric substrate and extending across the first end portion, the central portion and at least a portion of the second end portion, and
a second electrode disposed inside the piezoelectric substrate and extending across the second end portion and at least a portion of the central portion;
a supporting member configured to clamp at least a portion of the second end portion such that the central portion and the first end portion extend into an internal space of the supporting member;
a first outer electrode disposed on a first surface of the supporting member and electrically connected to the first electrode; and
a second outer electrode disposed on a second surface of the supporting member and electrically connected to the second electrode,
wherein a distance between the first electrode and the second electrode in the second end portion of the piezoelectric substrate is greater than a distance between the first electrode and the second electrode in at least one of the central portion and the first end portion of the piezoelectric substrate.

2. The acceleration sensor according to claim 1, wherein the central portion is polarized.

3. The acceleration sensor according to claim 1, wherein the first electrode opposes the second electrode in a thickness direction of the piezoelectric substrate.

4. The acceleration sensor according to claim 1, wherein the piezoelectric substrate is lead zirconate titanate (PZT).

5. The acceleration sensor according to claim 1, wherein a portion of the piezoelectric substrate between the first electrode and the second electrode in the second end portion has a thickness greater than a thickness of a portion of the piezoelectric substrate between the first electrode and the second electrode in the central portion.

6. The acceleration sensor according to claim 5, wherein the thickness of the portion of the piezoelectric substrate between the first electrode and the second electrode in the second end portion is at least 1.5 times greater than the thickness of the portion of the piezoelectric substrate between the first electrode and the second electrode in the central portion.

7. The acceleration sensor according to claim 1, wherein the supporting member comprises:
a pair of plate-shaped members configured to clamp the second end portion therebetween; and
a connecting member configured to connect the pair of plate-shaped members to each other to form the internal space.

8. The acceleration sensor according to claim 7, wherein the pair of plate-shaped members are flat plate-shaped members.

9. The acceleration sensor according to claim 7, wherein the pair of plate-shaped members each comprises an electrode extending along the respective plate-shaped member that electrically connects the first electrode to the first outer electrode.

10. The acceleration sensor according to claim 1, wherein the first end portion of the piezoelectric substrate is a free end.

11. The acceleration sensor according to claim 1, further comprising a conductive adhesive layer that bonds the piezoelectric element to the supporting member.

12. The acceleration sensor according to claim 1, wherein the supporting member is one of a ceramic, a resin or a metal member having an insulating coating.

13. The acceleration sensor according to claim 1, wherein the first electrode comprises first, second and third electrode layers, the first electrode layer disposed on the first surface of the piezoelectric substrate, the second electrode layer disposed on a second surface of the piezoelectric substrate that is opposite the first surface, and the third electrode layer disposed inside the piezoelectric substrate.

14. The acceleration sensor according to claim 13, wherein the first and second electrode layers extend across at least a portion of each of the first end portion, the second end portion and the central portion of the piezoelectric substrate.

15. The acceleration sensor according to claim 13, wherein the third electrode layer is parallel to the first and second surfaces of the piezoelectric substrate and extends across at least a portion of each of the central portion and the first end portion of the piezoelectric substrate.

16. The acceleration sensor according to claim 13, further comprising an electrode extending between the first and third electrode layers that electrically connects the first, second and third electrode layers of the first electrode to each other.

17. The acceleration sensor according to claim 1, wherein the second electrode comprises first and second electrode layers that are parallel to the first surface of the piezoelectric substrate.

18. The acceleration sensor according to claim 17, wherein the first and second electrode layers extend across the second end portion and at least a portion of the central portion of the piezoelectric substrate.

* * * * *